United States Patent [19]
Wang et al.

[11] Patent Number: 6,162,693
[45] Date of Patent: Dec. 19, 2000

[54] CHANNEL IMPLANT THROUGH GATE POLYSILICON

[75] Inventors: Zhongze Wang, Boise; Rongsheng Yang, Meridian, both of Id.

[73] Assignee: Micron Technology, Inc., Boise, Id.

[21] Appl. No.: 09/389,295

[22] Filed: Sep. 2, 1999

[51] Int. Cl.[7] .................................................. H01L 21/336
[52] U.S. Cl. ........................ 438/303; 438/514; 438/682
[58] Field of Search .................................... 438/291, 301, 438/302, 303, 305, 304, 514, 527, 629, 630, 586, 682; 257/392, 344; 148/1.5

[56] References Cited

U.S. PATENT DOCUMENTS

| | | | |
|---|---|---|---|
| 4,499,652 | 2/1985 | Shrivastava | 438/291 |
| 5,679,594 | 10/1997 | Rodde et al. | 438/217 |
| 5,773,863 | 6/1998 | Burr et al. | 257/344 |
| 5,946,579 | 8/1999 | Fulford, Jr. et al. | 438/303 |

FOREIGN PATENT DOCUMENTS 05335564  12/1993  Japan ........................................ 29/784

*Primary Examiner*—Matthew Smith
*Assistant Examiner*—Igwe U. Anya
*Attorney, Agent, or Firm*—Knobbe, Martens, Olson & Bear, LLP

[57] ABSTRACT

A field effect transistor having a doped region in the substrate immediately underneath the gate of the transistor and interposed between the source and drain of the transistor is provided. The doped region has a retrograde dopant profile such that the doping concentration immediately adjacent the gate is selected to allow for the formation of a channel when a threshold voltage is applied to the gate thereby eliminating the need for an enhancement doping step during formation of the transistor. The retrograde doping profile increases with the depth into the substrate which inhibits stray currents from traveling between the source and drain of the transistor in the absence of the formation of a channel as a result of voltage being applied to the gate of the transistor.

17 Claims, 6 Drawing Sheets

CHANNEL IMPLANT THROUGH GATE POLYSILICON

BACKGROUND OF THE INVENTION

1. Field of the Invention

The present invention relates to semiconductor devices and, in particular, concerns a semiconductor processing technique for the fabrication of field effect transistors which are configured to reduce the likelihood of punch through between the source and drain of the field effect transistors.

2. Description of the Related Art

The ever increasing scale of integration of integrated circuits has resulted in increasingly smaller device dimensions and has further resulted in device components being positioned closer and closer together in a semiconductor substrate. The close proximity of device structures results in problems in isolating device structures. For example, the demand for increasingly higher scales of integration of integrated circuits has resulted in field effect transistors where the source and drains of the transistors are positioned closer and closer together. In this particular circumstance, the close proximity to the source and the drain can result in electrical conduction between the source and drain that is not responsive to the formation of a conductive channel in the substrate as a result of activation of the gate of the transistor.

This particular phenomenon is known as punch through. Typically, punch through occurs as a result of the depletion region in the channel area of the field effect transistor resulting from the source and drain regions meeting with each other. This allows for electrical conduction of charge carriers between the source and drain regions of the transistor even in the absence of the application of voltage to a gate creating a conductive channel in the substrate. Once punch through occurs in the field effect transistor, the transistor is no longer operating in a desired manner which can affect the overall operation of the integrated circuit and can possibly even result in damage to the circuit.

To address the particular problems associated with punch through, various doping techniques for doping the channel region of the field effect transistor have been employed. It is well understood that increased dopant concentration in the channel region of the field effect transistor will limit the depletion region in the channel region such that the likelihood of punch through between the source and drain is reduced.

FIGS. 1A and 1B illustrate a typical technique for increasing the dopant concentration in a channel edge region and bottom of a source/drain region of a field effect transistor using a technique generally referred to as halo implant. As illustrated in FIG. 1A, after the formation of a gate stack 100, and prior to the formation of source and drain regions 102, 104 (FIG. 1B), doping ions are implanted into the channel edge region 105 and bottom of the source/drain region of the substrate 103 so as to increase the doping concentration of the channel edge region 105. Typically, boron atoms are implanted into an n-doped silicon substrate using well-known implantation techniques so as to define a region 106 of increased doping concentration in the channel region 105. Subsequent to the channel implant, the source region 102 and the drain region 104 are formed in a well-known manner resulting in the field effect transistor shown in FIG. 1B.

While the halo or pocket implant technique can be used for increasing the doping concentration in the channel edge region 105 between the source 102 and the drain 104 thereby reducing the likelihood of punch through, this technique does, however, also increase the amount of parasitic capacitance between the source 102 and the drain 104 and the substrate 103. In particular, there is an increase in the junction capacitance at the source 102 and the drain 104 of the field effect transistor such that the junction capacitance substantially contributes to the input capacitance of the transistor as a whole. Moreover since contact alignment limitations make it difficult to proportionally reduce the size of the source and drain regions in scaled down field effect transistors, the problem with increased junction capacitance is amplified even further.

As is understood in the art, a large input capacitance on a field effect transistor limits the switching speed of the device. In particular, the switching speed of the transistor is determined by the amount of time that is required to reconfigure the channel between a conducting state and an insulating state. Furthermore, the channel is reconfigured by adding or removing charge to and from the gate, the speed of which is dependent on the rise and fall times that the control voltage applied either across the source and gate or the drain and gate of the transistor. Thus, since the input capacitance of the transistor forms a part of an RC circuit which limits the rise and fall times of the control voltage, a relatively large input capacitance will result in a relatively slow switching speed. Hence, while halo or pocket implants are capable of reducing punch through, it is achieved at the cost of a slower device.

Another prior art technique for limiting punch through is illustrated in FIGS. 2A and 2B. In this approach, isolation regions 122 are formed in a semiconductor substrate 120 and an oxide layer 124 is grown over the active area 123. A masking layer 125 is then positioned on top of the oxide 124 and is patterned and etched in the manner shown in FIG. 2A. Subsequently, doping atoms, such as boron, are implanted through the oxide layer 124 so as to form a region 126 of increased doping concentration within the channel region 127 of the semiconductor substrate 120. Subsequently, the sacrificial oxide layer 124 is removed and a gate stack is formed on the upper surface of the substrate in the manner that is shown in FIG. 2B.

By implanting the boron directly into the substrate, the problems of increased junction capacitance occurring in the halo implant procedure is reduced. However, this technique of reducing punch through by increasing the doping concentration through direct implantation also has several shortcomings. In particular, the gate stack formation typically requires the growth of a gate oxide region after the removal of the sacrificial oxide layer 124. Gate oxide formation typically requires the use of a high temperature oxidation procedure which results in diffusion of the dopant atoms within the semiconductor substrate.

Specifically, the high temperature oxidation procedure used to grow a gate oxide 150 of a gate stack 152 typically results in diffusion of the dopant atoms in the doped region 126 in the channel region 127 such that the dopant atoms no longer have a retrograde profile (as represented by the dashed lines in FIG. 2B). In fact, the doping profile, i.e., the dopant concentration, is more uniform from the upper surface of the substrate 120 immediately adjacent the gate oxide 150 to the bottom of the channel region 127 adjacent the bottom surfaces of the source and drain regions 154, 156 formed in the substrate 120.

The non-retrograde doping profile typically results in decreased protection against punch through for very small dimension devices. In particular, the maximum doping concentration at the surface of the semiconductor substrate immediately adjacent the gate oxide is dictated by the desired threshold voltage. The desired threshold voltage is the voltage that must be applied to the gate in order to form a channel in the substrate 120 and thereby activate the device. Typically, this voltage is relatively low which results in a comparatively low doping concentration in the substrate 120 immediately underneath the gate oxide 150. Due to the diffusion of the implanted species in the channel region 127 as a result of the wet oxidation formation of the gate oxide, the doping concentration in the remainder of the channel region is comparable to the doping concentration immediately underneath the gate oxide which can be relatively ineffective at preventing punch through with devices exhibiting smaller geometries.

From the foregoing, it will be apparent that there is a need for smaller dimension field effect transistor configurations that are adapted to inhibit punch through in the channel regions. To this end, there is a need for device fabrication techniques whereby the channel region can be configured to inhibit punch through while still allowing for acceptable threshold voltages.

SUMMARY OF THE INVENTION

The aforementioned needs are satisfied by the transistor of the present invention which is comprised of a source and a drain region formed in a semiconductor substrate with a channel region interposed therebetween and a gate positioned adjacent the channel region. The channel region is doped so as to have a retrograde profile with an initial doping concentration immediately adjacent the upper surface of a substrate that is selected to allow for formation of a channel when a desired threshold voltage is applied to the gate, wherein the doping concentration increases from the initial doping concentration so as to further inhibit punch through between the source and the drain regions. The channel region has the lowest concentration immediately adjacent the upper surface of the substrate adjacent the gate and is further configured to allow for the formation of a conducting channel upon application of a threshold voltage to a gate. The doping profile preferably increases at a distance from the upper surface of the substrate so as to inhibit the depletion regions created by the source and drain from meeting in the channel region.

In another aspect of the invention, a method of forming a field effect transistor is provided. In this aspect, a gate stack, including a gate oxide layer, is initially formed on an upper surface of a semiconductor wafer. Implantation then occurs wherein a doping species is implanted into a channel region of the semiconductor substrate through the gate stack. The implanting steps result in the channel region of the substrate having a retrograde doping profile with doping concentration increasing from a first value immediately adjacent the gate oxide substrate interface to a maximum value occurring at a selected depth within the substrate.

Subsequent to the formation of a channel region having a retrograde doping profile, the source and drain regions are then formed on either side of the channel region and the remainder of the gate stack is further formed on top of the gate oxide. By implanting the doping species subsequent to the gate oxide formation, diffusion of the doping species is reduced which thereby maintains the retrograde profile characteristic of the implanted channel region during subsequent process steps. As a result of having a channel region with a retrograde doping profile, punch through between the source and drain region is inhibited in devices formed according to the method.

From the foregoing, it will be appreciated that a field effect transistor can be formed wherein the likelihood of punch through between the source and drain occurring without the application of a threshold voltage on the gate is reduced. This and other objects of the present invention will become more fully apparent from the following description taking in conjunction with the accompanying drawings.

DETAILED DESCRIPTION OF THE PREFERRED EMBODIMENT

Figure 1A:
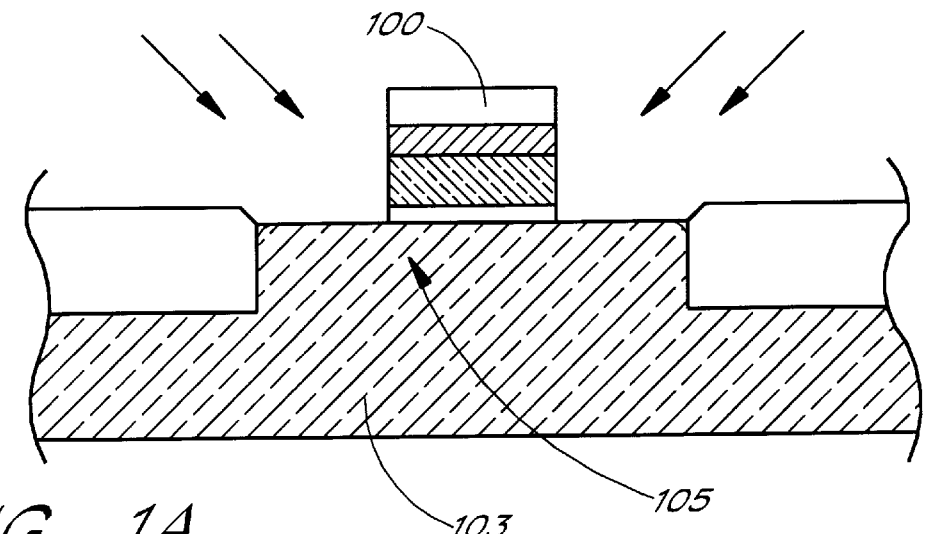
FIGS. 1A and 1B are partial schematic sectional views of a conventionally formed MOSFET device illustrating a halo or pocket implant technique.
Figure 1B:
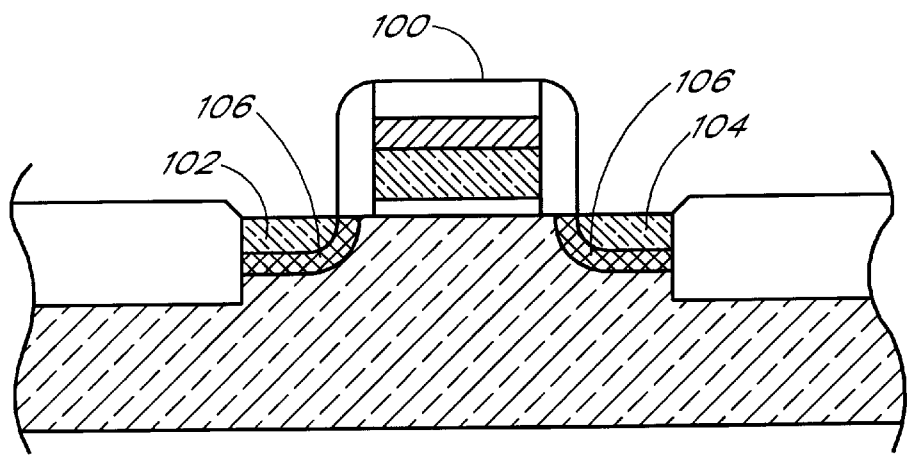
Figure 2A:
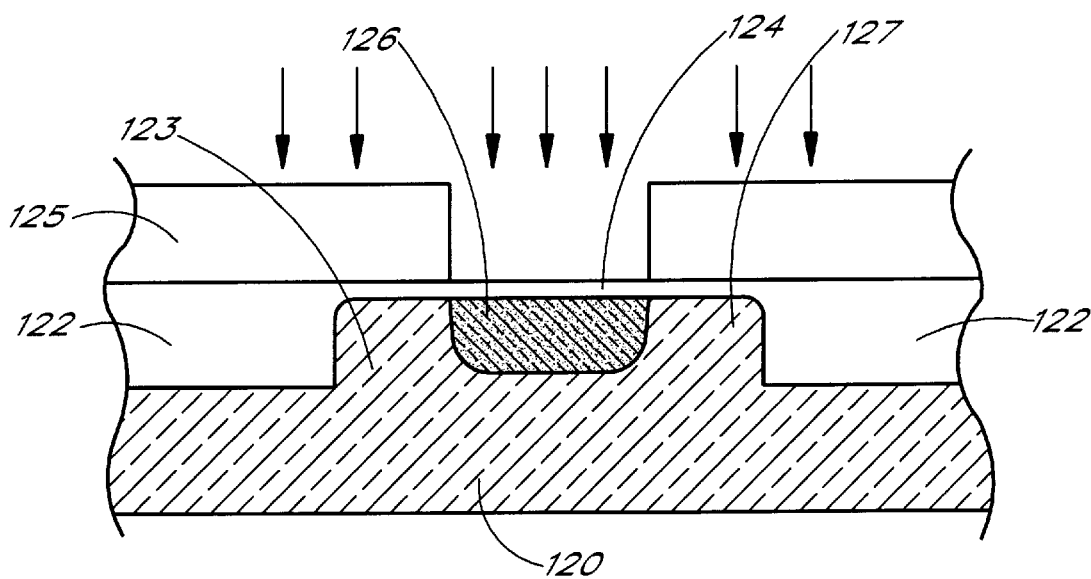
FIGS. 2A and 2B are partial schematic sectional views of a conventionally formed MOSFET transistor illustrating a conventional localized channel implant procedure.
Figure 2B:
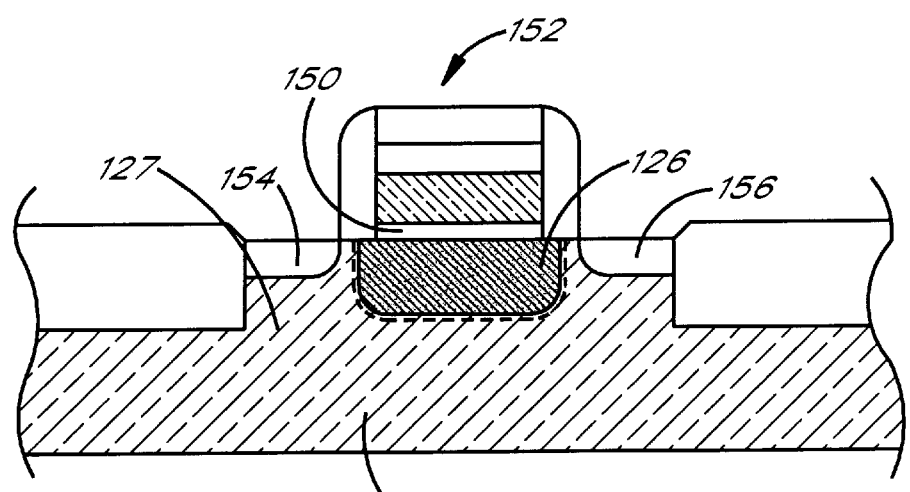
Figure 3A:
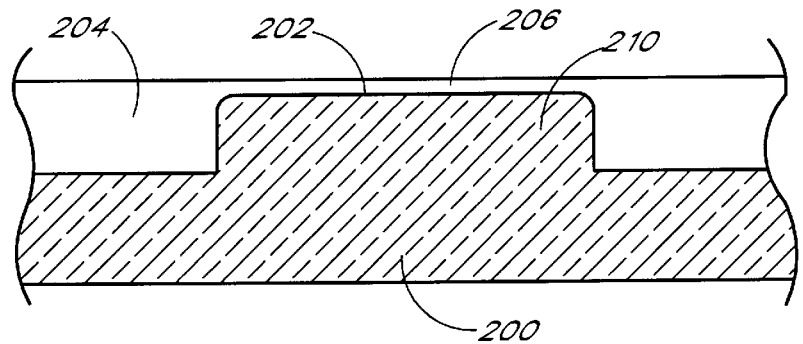
FIGS. 3A through 3H are partial schematic sectional views of semiconductor substrates illustrating the formation of a field effect transistor and further illustrating a unique implantation procedure.

Reference will now be made to the drawings where in like numerals refer to like parts throughout. As illustrated in FIG. 3A, a silicon substrate 200 is prepared for the formation of a field effect transistor. In particular, isolation regions 204 are formed in a first surface 202 of the substrate 200. Typically, the substrate 200 is comprised of a silicon substrate, such as an intrinsic or lightly doped substrate, and the isolation regions 204 are formed of silicon oxide ($SiO_2$) using well known LOCOS isolation techniques or shallow trench isolation techniques (STI). Generally, a sacrificial oxide layer 206 is also formed on the first surface 202 of the silicon substrate 200.

The formation of the isolation regions 204 and the sacrificial oxide layer 206 is performed using well known isolation and oxidation techniques. As is understood in the art, the purpose of the isolation regions 204 is to isolate an active area 210 in which an active device, such as a field effect transistor, is to be formed. The purpose of the sacrificial oxide layer 206 is to enhance the profile of the isolation region 204. In particular, the isolation region is, in this embodiment, comprised of a well-known shallow trench isolation (STI) formation and the growth of a sacrificial oxide layer 206 during the formation of the isolation structures 204 results in a preferred rounded configuration of the isolation regions 204.

Figure 3B:
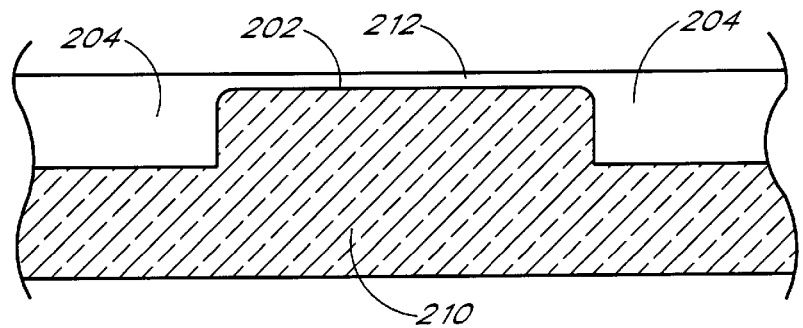
Figure 3C:
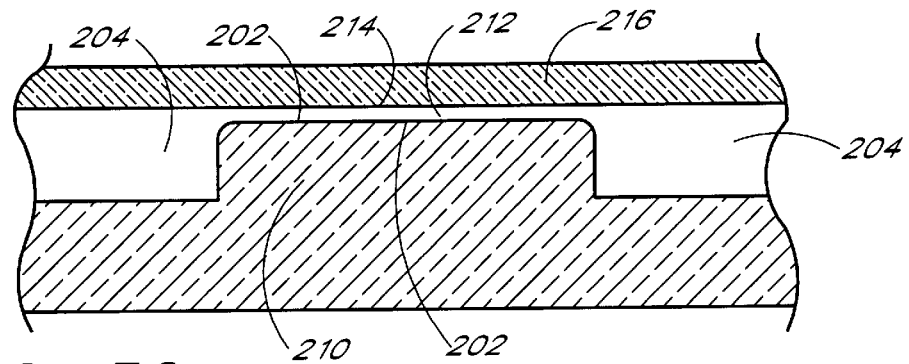

As illustrated in FIG. 3B, subsequent to the formation of the isolation regions 204 and the sacrificial layer 206, the sacrificial layer 206 is removed using well-known etching techniques so as to expose the upper surface 202 of the active area 210 of the substrate 200. Subsequently, a gate oxide 212 is formed on the upper surface 202 of the semiconductor substrate 200 adjacent the active area 210. The gate oxide 212 will form the portion of a gate of a field effect transistor and, as a consequence, the gate oxide 212 is formed using well-known gate oxide growth techniques, such as dry/wet/dry or dry only oxidation, so as to form a gate oxide of a predetermined thickness, such as 45 Angstroms. As indicated in FIG. 3B, the gate oxide 212 is formed on the upper surface 202 of the active area 210 of the device prior to any enhancement implantation or doping of the active area 210 of the device. As is generally understood in the art, the gate oxide is grown using high temperature oxidation techniques which can result in diffusion or migration of dopants implanted within the active area 210 of the substrate 200 and segregation of dopants from the active area 210 of the substrate 200 to the gate oxide 212. Hence, by forming the gate oxide 212 on the upper surface 202 of the active area 210 prior to any implantation of the active area 210, such diffusion or segregation of dopants can be reduced.

Subsequently, a conductive layer 216 is formed in an upper surface 214 of the gate oxide layer 212. In this embodiment, a conductive polysilicon layer 216 is formed on the upper surface 214 of the gate oxide 212 using well-known polysilicon deposition techniques such as LPCVD. In one embodiment, the polysilicon layer 216 is formed to a thickness such as 850 Angstroms. As will be discussed in greater detail below, the polysilicon layer 216 is used to form a conductive portion of the gate of a field effect transistor such that application of electrical potential to the polysilicon layer 216 of the gate will result in the formation of a channel region in the active area 210 immediately adjacent the interface between the silicon substrate 200 and the gate oxide layer 212.

Figure 3D:
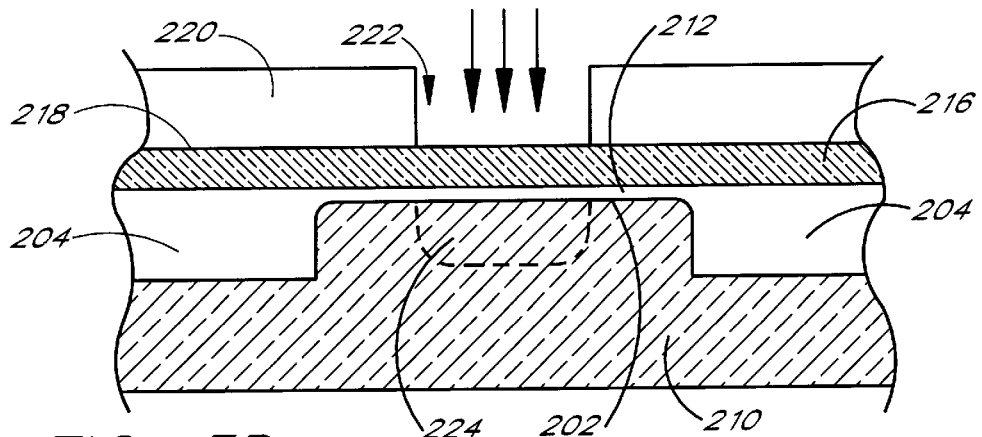

As is illustrated in FIG. 3D, an implantation procedure is then used to implant a region 224 of the active area 210. In particular, a layer of photoresist 220 is positioned on an upper surface 218 of the polysilicon layer 216. The photoresist 220 is then patterned so as to form an opening 222 that exposes the polysilicon layer 216 in a location that is above the active area 210 of the semiconductive substrate 200 using well-known photo-lithography techniques. Subsequently, dopant atoms are implanted into the substrate 200 through the polysilicon layer 216 and through the gate oxide 212 using well-known implantation techniques.

In particular, Boron 11 ($B_{11}$) atoms are implanted through the polysilicon layer 216 and the gate oxide 212 so as to dope the region 224 of the active area 210 of the semiconductor substrate 200. The implantation of the boron is preferably accomplished at an energy selected so that the doping profile of the implanted region 224 of the active area 210 of the substrate 200 is generally a retrograde doping profile.

Figure 4:
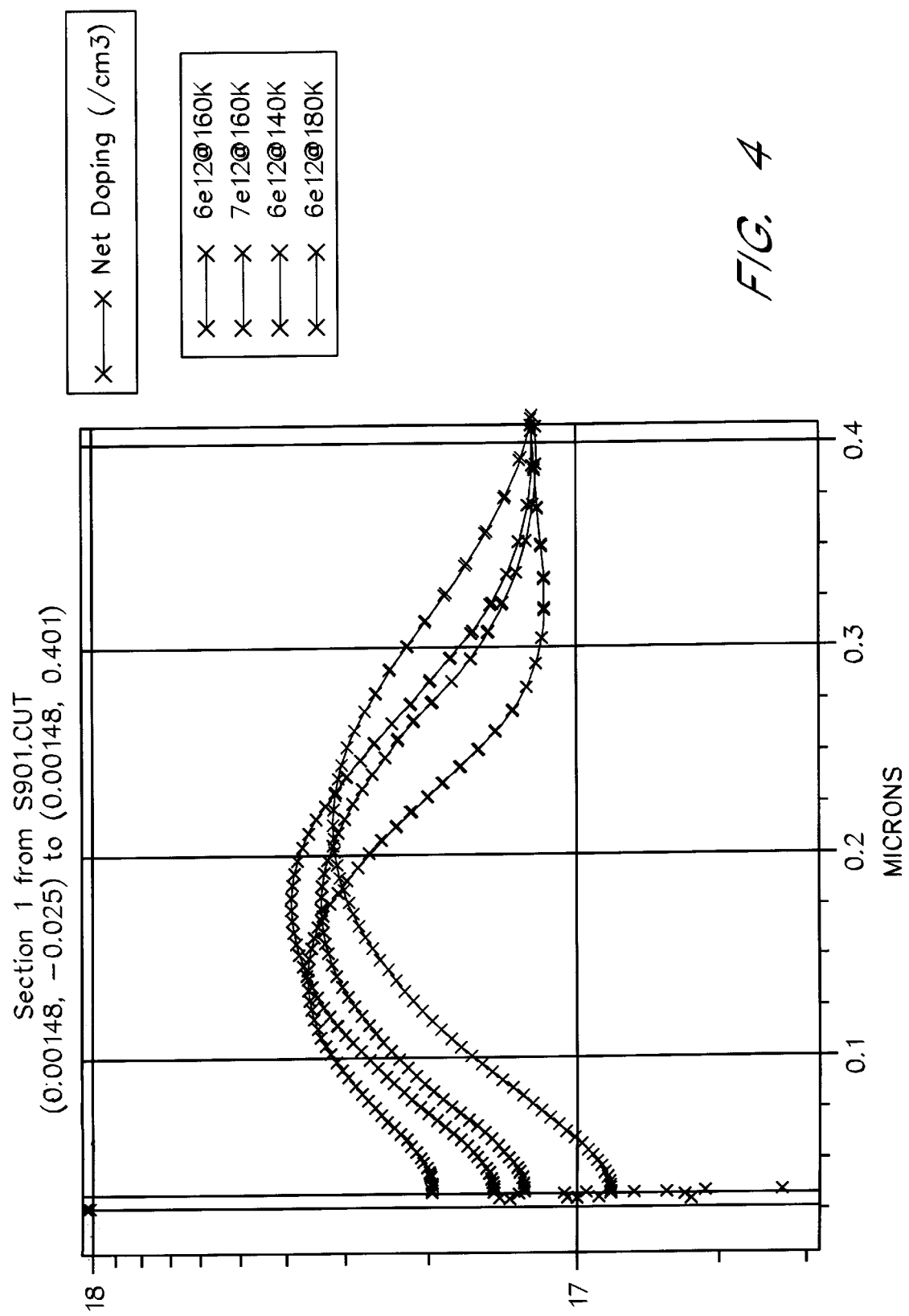
FIG. 4 is a schematic illustration illustrating the doping profile of the substrate of a field effect transistor device formed in accordance with the method of FIGS. 3A through 3H.

In particular, the concentration of dopant atoms in the substrate 200 immediately adjacent the surface 202 is at a minimum value and the concentration of dopant atoms increases into the depths of the active area 210 from the surface 202. In other words, the dopant concentration increases in the active area 210 from a pre-selected value at the surface 202 to a maximum value located in a pre-selected depth from the surface 202 within the active area 210. In one embodiment, the dopant concentration then begins to decrease from the maximum value at the pre-selected depth. FIG. 4 illustrates some sample dopant profiles within the active area 210 of the substrate 200 obtained using the process described herein. As illustrated in these exemplary doping profiles, the doping concentration at the surface 202 is approximately $1 \times 10^{17}$ doping ions per $cm^3$ at the surface 202 and then increases to a peak value of approximately $5 \times 10^{17}$ doping, ions per $cm^3$.

As will be described in greater detail below, because the implantation procedure occurs following the gate oxide formation, the retrograde doping profile is not diffused as a result of high temperature oxidation procedures performed to grow the gate oxide layer 212. This results in a doping profile that can have a value adjacent the surface 202 that is selected to allow for proper channel formation, thereby eliminating the requirement of an enhancement dopant step which is commonly performed in the prior art prior to formation of the gate oxide. Moreover, as the doping profile increases from the surface 202 with the depth of the substrate 200, the likelihood of punch through between a source and drain region of a field effect transistor is reduced.

Figure 3E:
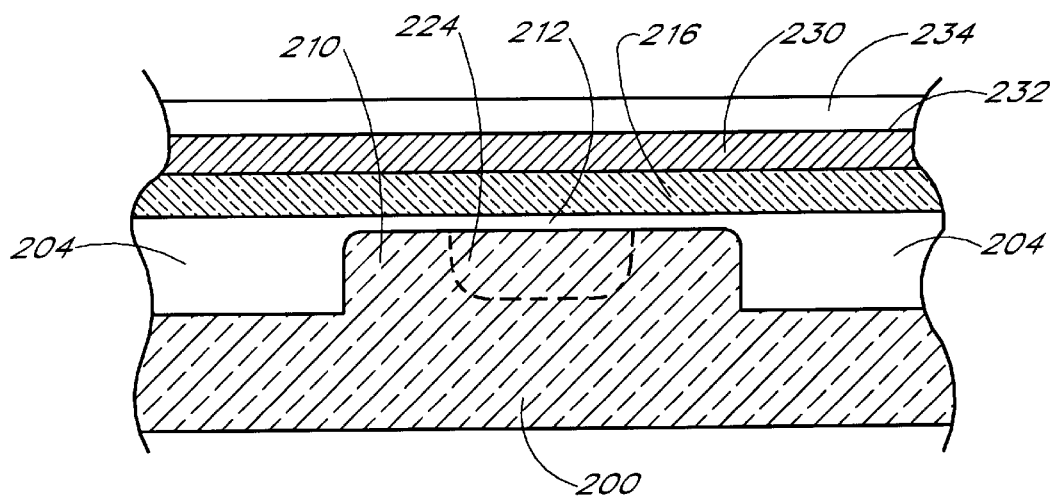

As is illustrated in FIG. 3E, following the implantation procedure, a metal layer 230, such as tungsten silicide ($WSi_x$) or tungsten or titanium nitride (WTiN), can be deposited over the polysilicon layer 216. Typically, the metal layer 230 is deposited and is then patterned and etched so as to form conductive interconnects between the gate of the field effect transistor and other devices formed on the substrate 200. As is also illustrated in FIG. 3E, a cap layer 234 is positioned on the outer surface 232 of the metal layer. The cap layer 234 is typically comprised of an isolation material, such as a TEOS formed oxide layer, and provides further isolation for the gate of a subsequently formed transistor in a well-known manner.

Figure 3F:
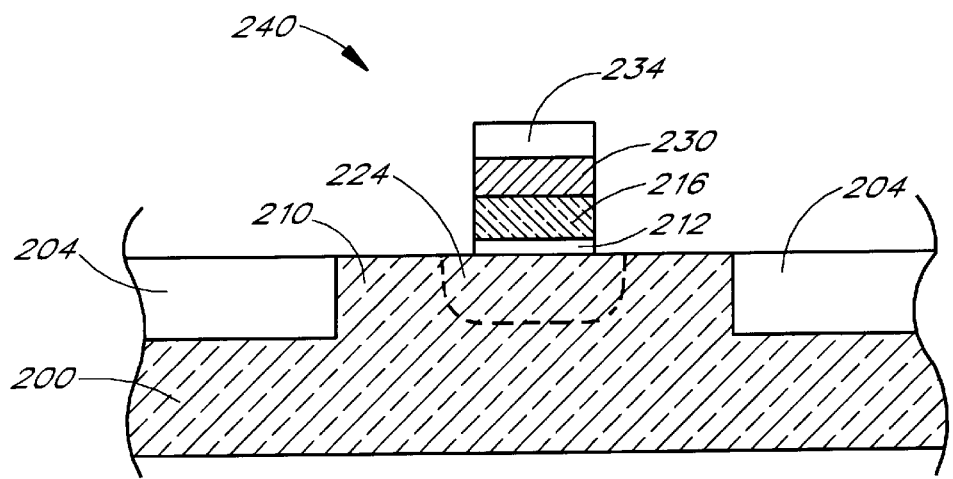

As illustrated in FIG. 3F, the layers positioned on the upper surface 202 of the substrate is then patterned and etched in a well-known manner to form a gate stack 240. The gate stack 240 is thus comprised of the gate oxide layer 212, the polysilicon layer 216, the metal layer 230, and the cap layer 234. Preferably, the gate stack is positioned over the doped region 224 in the active area 210 of the silicon substrate 200. The patterning and etching of the layers comprising the gate stack 240 is accomplished in a manner known in the art.

Figure 3G:
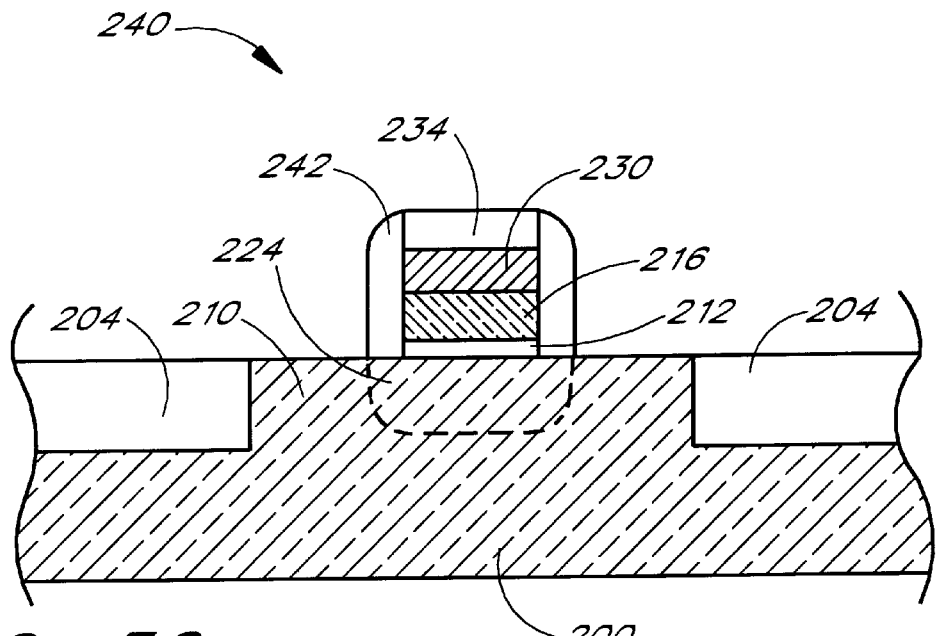

As illustrated in FIG. 3G, subsequent to patterning and forming the gate stack 240, lateral cap structures 242, known as spacers, can then be formed about the gate stack to provide further isolation of the gate stack 240. The lateral cap layers 242 are formed using well known spacer formation techniques, such as a deposition of Si oxide or Si nitride film followed by etch back.

Figure 3H:
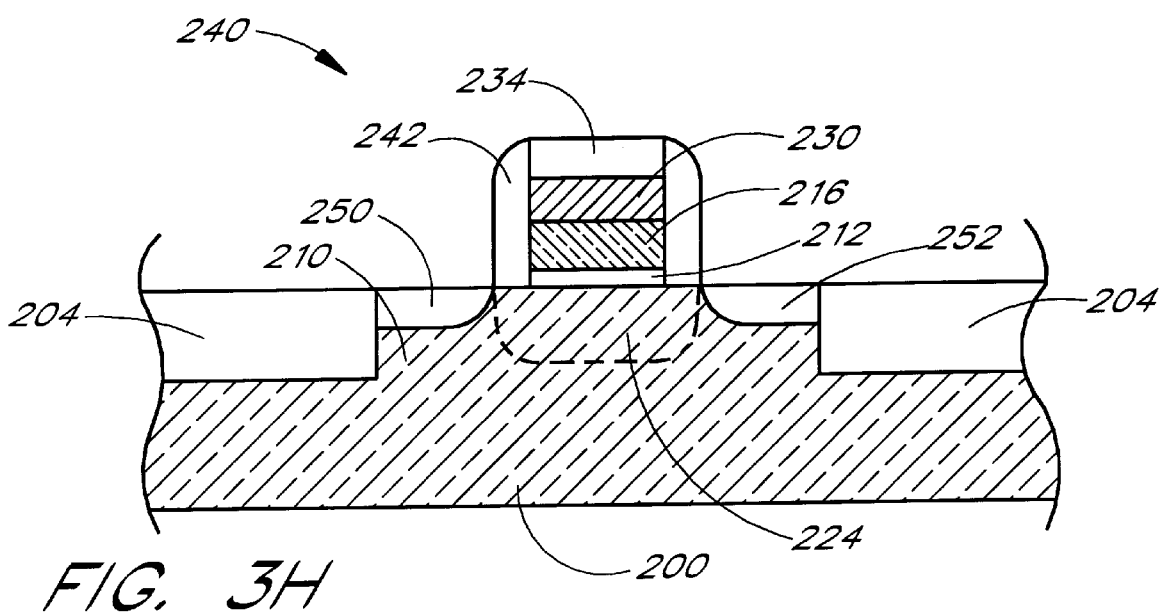

As is illustrated in FIG. 3H, following the formation of the lateral cap structures 242, a source region 250 and a drain region 252 are formed in the active area 210 of the semiconductor substrate 200 so as to be immediately adjacent the upper surface 202 of the substrate 200. The source region 250 and the drain region 252 are formed by selectively masking and then implanting or doping selectively exposed regions of the active area 210 of the substrate 200 in a well-known manner so as to produce different doped regions that will comprise the source and drain regions 250, 252. As is illustrated in FIG. 3H, the source and drain regions 250, 252 are positioned immediately adjacent the gate stack 240 such that the edge of the source and drain region 250, 252 immediately adjacent the upper surface 202 is located substantially adjacent the doped region 224 of the silicon substrate 200.

As discussed above, the portion of the doped region 224 immediately adjacent the upper surface 202 and immediately adjacent the oxide layer 212 of the gate stack 240 is the region in which a channel will be created between the source region 250 and the drain region 252 as a result of application of voltage to the gate stack 240. However, as the doping profile within the doped region 224 is retrograde, the region 224 is more heavily doped in the area between the source region 250 and the drain region 252 at increased depths from the upper surface 202 of the substrate 200. This increase in doping at increased depths of the silicon substrate 200 reduces the likelihood that there will be stray currents traveling from the source region 250 to the drain region 252 or vice versa in the absence of an application of voltage to the gate stack 240 to generate a channel immediately adjacent the upper surface 202 of the silicon substrate 200.

As discussed previously, FIG. 4 is a diagram which illustrates a doping profile within the doped region 224 of the active area 210 of the substrate 200 for an exemplary 0.25 µm. As illustrated in FIG. 4, the profile is essentially retrograde such that the doping profile increases from an initial value of approximately $9.5 \times 10^{16}$ to $2.0 \times 10^{17}$ dopant atoms per $cm^3$ at the upper surface 202 of the substrate 200 to a peak value of approximately $3 \times 10^{17}$ dopant atoms per $cm^3$ located at approximately 0.15 to 0.20 microns beneath the surface 202 of the substrate and then decreases from the depth of 0.15 to a depth of approximately 0.4 microns at which the dopant concentration stabilizes. It will be appreciated that the above-indicated values are simply examples and will change for different channel lengths.

Preferably, the dopant concentration adjacent the surface 202 is selected such that application of a threshold voltage $V_t$ to the gate 240 of the transistor produces a channel that extends between the source region 250 and the drain region 252 and allows conduction of charge carriers therebetween. As is well known in the art, the dopant concentration immediately adjacent the surface 202 can be selected such that application of t particular threshold voltage will generate a conductive channel between the source and drain regions 250, 252. Typically, in the prior art, a separate enhancement doping step is performed in order to obtain doping of an active area 210 adjacent the surface 202 that will result in channel formation with the application of a given threshold voltage $V_t$. By doping the dopant region 224 in a manner that creates the retrograde doping profile illustrated in FIG. 4, the dopant concentration immediately adjacent the surface 202 can be achieved which obtains a given threshold voltage without requiring a separate enhancement doping step. This results in a simplified and less expensive process for forming field effect transistors.

Preferably, the peak dopant concentration occurs at a depth which approximately corresponds to the depth of the source and drain regions 250, 252. Moreover, the doping profile is contoured such that the increase of dopant concentration between the source region 250 and the drain region 252 increases sharply from the initial dopant concentration to values which will inhibit stray charge carriers from traveling between the source region 250 and the drain region 252. In particular, the increase in the dopant concentration of the doped region 224 between the source 250 and drain 252 at a distance from the surface 202 inhibits the formation of depletion regions about the source 250 and the drain 252 that would contact each other.

Hence, field effect transistors can be formed which are less likely to experience stray currents traveling from source to drain without activation by the gate. Moreover, the illustrated process can also provide a particular threshold dopant concentration without the use of a separate enhancement dopant step. In the illustrated embodiment, these advantages stem from a retrograde doping profile that occurs as a result of forming a doped region in the active area of the substrate by implanting the dopant species through the previously formed gate oxide and polysilicon layers. In this way, diffusion or segregation of the dopant species in the doped region can be reduced due to the elimination of a high temperature oxidation step following implantation that could result in migration of the dopant species into a less retrograde profile.

Although the preferred embodiments of the present invention have shown, described and pointed out the fundamental novel features of the invention, as applied to these embodiments, it will be understood that various omissions, substitutions and changes in the form of the detail of the device illustrated may be made by those skilled in the art without departing from the spirit of the present invention. Consequently the scope of the invention should not be limited to the foregoing description, but should be defined by the appended claims.

What is claimed is:

1. A method of forming a transistor in a semiconductor substrate, the method comprising:

forming a gate oxide layer and a poly layer on a first surface of the substrate;

implanting a masked channel region of the substrate through the gate oxide and poly layers so that the channel region has a retrograde doping profile wherein the initial value of the doping concentration of the channel region is selected so that application of a pre-selected threshold voltage to a later formed gate stack results in the formation of a conductive channel between the source and drain regions in the channel region wherein the channel region is positioned within a first area of the substrate;

positioning one or more conductive layers on top of the gate oxide layer;

patterning the gate oxide layer and the one or more conductive layers so as to define a gate stack over the channel region of the substrate such that the gate stack has substantially the same length of the first area of the substrate and the channel region formed therein so that the length of the channel region is substantially the same as the length of the gate stack; and forming a source and drain regions in the substrate wherein the channel region between the source and drain regions have the retrograde doping profile.

2. The method of claim 1, wherein forming a gate oxide layer comprises using an oxidation technique to grow a silicon oxide layer of approximately from 20 to 100 Angstroms.

3. The method of claim 1, wherein implanting the channel region comprises implanting boron atoms through the gate oxide layer so that the doping concentration at the interface between the substrate is at an initial value and then increases to a peak value located at a first depth beneath the first surface of the substrate.

4. The method of claim 3, wherein implanting the channel region comprises implanting the channel region so that the peak value of the doping concentration occurs at a depth substantially equal to the depth at which the source and drain regions are formed in the substrate.

5. The method of claim 1, wherein positioning the one or more conductive layers on top of the gate oxide layer comprises forming a polysilicon layer on top of the gate oxide layer.

6. The method of claim 5, wherein implanting a channel region of the substrate comprises implanting dopant atoms through the polysilicon layer and the gate oxide layer.

7. The method of claim 5, wherein positioning one or more conductive layers on top of the gate oxide layer further comprises forming a metal layer on top of the polysilicon layer.

8. The method of claim 7, further comprising forming the metal layer so as to interconnect the gate stack to another electrical device formed on the substrate.

9. A method of forming a transistor in a semiconductor substrate the method comprising:

forming a gate stack on a first surface of the substrate;

forming a source region in the substrate adjacent the first surface of the substrate;

forming a drain region in the substrate wherein formation of the source and drain region defines a channel region that separates the source region and the drain region and wherein the gate stack is positioned over the channel region;

masking the first surface of the substrate so as to expose only a first region of the substrate that corresponds to the channel region;

doping the first region between the source region and the drain region while the first surface is masked so that the doping of the first region results in a channel region having a retrograde doping profile that is not diffused as a result of the forming of the gate stack.

10. The method of claim 9, wherein doping the first region comprises implanting boron atoms subsequent to formation of a gate oxide layer of the gate stack so that the doping concentration at the interface between the substrate and the gate stack is at an initial value and then increases to a peak value located at a first depth beneath the first surface of the substrate.

11. The method of claim 10, wherein doping the first region comprises implanting the first region so that the peak value of the doping concentration occurs at a depth substantially equal to the depth at which the source and drain regions are formed in the substrate.

12. The method of claim 10, wherein doping the first region comprises implanting the first region so that the initial value of the doping concentration is selected so that application of a pre-selected threshold voltage to the gate stack results in the formation of a conductive channel between the source and drain regions in the channel region.

13. The method of claim 10, wherein doping the first region comprises implanting the channel region so that the initial value of the doping concentration is within an approximate range of $9.5 \times 10^{16}$ to $2 \times 10^{17}$ dopant atoms per $cm^3$ and wherein the peak dopant concentration is approximately $4 \times 10^{17}$ dopant atoms per $cm^3$ at a depth of approximately 0.175 microns beneath the first surface of the substrate for a device having a channel length of 0.25 $\mu$m.

14. The method of claim 13, wherein forming the gate stack comprises positioning a gate oxide on the first surface of the substrate and positioning a polysilicon layer on top of the gate oxide.

15. The method of claim 14, wherein doping the first region of the substrate comprises implanting dopant atoms through the polysilicon layer and the gate oxide layer.

16. The method of claim 9, wherein forming the source region and the drain region comprises doping the semiconductor substrate to form the source and drain regions.

17. The method of claim 16, wherein forming the source region and the drain region comprises forming the regions so as to be approximately 0.05 to 1 $\mu$m apart.

\* \* \* \* \*